(12) United States Patent
Sumitomo et al.

(10) Patent No.: US 7,629,187 B2
(45) Date of Patent: Dec. 8, 2009

(54) FABRICATION METHOD OF SEMICONDUCTOR LUMINESCENT DEVICE

(75) Inventors: Hiroyuki Sumitomo, Yamanashi (JP); Satoshi Kajiyama, Yamanashi (JP); Makoto Ueda, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 451 days.

(21) Appl. No.: 11/651,488

(22) Filed: Jan. 10, 2007

(65) Prior Publication Data
US 2007/0166961 A1 Jul. 19, 2007

(30) Foreign Application Priority Data
Jan. 19, 2006 (JP) .............................. 2006-010789

(51) Int. Cl.
*H01L 21/00* (2006.01)
(52) U.S. Cl. .............................. 438/22; 438/29; 438/31; 438/46; 257/E21.001
(58) Field of Classification Search ................... 438/22, 438/29, 31, 32, 34, 46
See application file for complete search history.

(56) References Cited

U.S. PATENT DOCUMENTS 7,561,608 B2 * 7/2009 Takase .................. 372/45.01

2004/0264520 A1 12/2004 Takase

FOREIGN PATENT DOCUMENTS

CN 1578028 A 2/2005
JP 2005-19679 A 1/2005

OTHER PUBLICATIONS

Chinese Office Action dated Jun. 13, 2008, Application No. 200710013092.

* cited by examiner

*Primary Examiner*—Jack Chen
(74) *Attorney, Agent, or Firm*—Westerman, Hattori, Daniels & Adrian, LLP

(57) ABSTRACT

A fabrication method of a semiconductor luminescent device includes forming a compound semiconductor layer having a structure in which a first conductivity-type clad layer, an active layer, a second conductivity-type clad layer are layered in order on a substrate, the second conductivity-type being different from the first conductivity-type and forming a low-refractive-index region in a waveguide in an area to be an end face from which an output light from the waveguide in the compound semiconductor layer is emitted, the low-refractive-index region having an equivalent refractive-index lower than that of another area in the waveguide. The step of forming the low-refractive-index region includes determining a width of the low-refractive-index region in a longitudinal direction of the waveguide so that an emission angle of the output light of the semiconductor luminescent device is controlled to be a desirable value, and forming the low-refractive-index region having the width.

4 Claims, 14 Drawing Sheets

WIDTH OF LOW-REFRACTION-INDEX REGION (μm)

WIDTH OF LOW-REFRACTION-INDEX REGION (μm)

FABRICATION METHOD OF SEMICONDUCTOR LUMINESCENT DEVICE

BACKGROUND OF THE INVENTION

1. Field of the Invention

This invention generally relates to a fabrication method of a semiconductor luminescent device, and in particular, relates to a fabrication method of a semiconductor luminescent device having a low-refractive-index region around an end face thereof from which a light is emitted.

2. Description of the Related Art

A semiconductor luminescent device such as a laser diode (LD) emitting a light is used in a field of an optical communication and an optical storage media device. In particular, there is a demand for reducing an aspect ratio of an emission angle in order to improve optical use efficiency, if an optical storage device such as CD or DVD is used for an optical pickup.

FIG. 1 illustrates an emission angle. A light emitted from the semiconductor laser 60 is enlarged in a horizontal direction and a vertical direction of a substrate constituting the semiconductor laser. In the output light, an optical intensity is highest in the center thereof and is lower away from the center in the horizontal and the vertical directions. Angles, where the optical intensities of the output light in the horizontal direction and in the vertical direction are more than half of that in the center, are referred to a horizontal emission angle $\theta_H$ and a vertical emission angle $\theta_V$ respectively. Reducing the aspect ratio of the emission angle is controlling a ratio of the horizontal emission angle $\theta_H$ and the vertical emission angle $\theta_V$ to be closer to 1.

Japanese Patent Application Publication No. 2005-19679 discloses a method of controlling an equivalent refractive index of a ridge and the both sides thereof in a window area of a ridge-structure semiconductor laser to be higher than that of a ridge and the both sides thereof in a gain area except for the window area, in order to reduce the aspect ratio of the emission angle.

Generally, the vertical emission angle $\theta_V$ is higher than the horizontal emission angle $\theta_H$. And reducing the vertical emission angle $\theta_V$ is advantageous for reducing the aspect ratio of the emission angle. However, a refractive index of a clad layer is increased or a thickness of an active layer is reduced in order to reduce the vertical emission angle $\theta_V$. It is preferable that confinement of a light around the active layer in the vertical direction is reduced by changing the structure of an epitaxial layer. These processes, however, cause a reduction of a gain of the active layer. Accordingly, a threshold carrier density is increased. And a threshold current is increased and an optical output power is limited by thermal saturation.

In addition, in a method of changing the vertical emission angle $\theta_V$ according to the structure of the epitaxial layer, it is necessary to change the structure of the epitaxial layer according to every required emission angle. Therefore it takes time to satisfy the different demands of the emission angle. Further, when the thickness of the epitaxial layer differs in the wafer plane, the emission angle changes in the wafer plane. And a defective fraction of the semiconductor laser increases.

SUMMARY OF THE INVENTION

The present invention provides a fabrication method of a semiconductor luminescent device that can reduce the aspect ratio of the emission angle, that can satisfy the demand of the emission angle, or that can reduce the defective fraction in the wafer.

According to an aspect of the present invention, preferably, there is provided a fabrication method of a semiconductor luminescent device. The method includes forming a compound semiconductor layer and forming a low-refractive-index region. The compound semiconductor has a structure in which a first conductivity-type clad layer, an active layer, a second conductivity-type clad layer are layered in order on a substrate. The second conductivity-type is different from the first conductivity-type. The low-refractive-index region is in a waveguide in an area to be an end face from which an output light from the waveguide in the compound semiconductor layer is emitted. The low-refractive-index region has an equivalent refractive-index lower than that of another area in the waveguide. The step of forming the low-refractive-index region includes determining a width of the low-refractive-index region in a longitudinal direction of the waveguide so that an emission angle of the output light of the semiconductor luminescent device is controlled to be a desirable value, and forming the low-refractive-index region having the width.

With the above-mentioned configuration, it is possible to reduce an aspect ratio of an emission angle, it is possible to satisfy a demand of the emission angle in a short time, or it is possible to reduce a defective fraction in a wafer.

According to another aspect of the present invention, preferably, there is provided a fabrication method of a semiconductor luminescent device. The method includes forming a compound semiconductor layer and forming a low-refractive-index region. The compound semiconductor layer has a structure in which a first conductivity-type clad layer, an active layer, a second conductivity-type clad layer are layered in order on a substrate. The second conductivity-type is different from the first conductivity-type. The low-refractive-index region is in a waveguide in an area to be an end face from which an output light from the waveguide in the compound semiconductor layer is emitted. The low-refractive-index region has an equivalent refractive-index lower than that of another area in the waveguide. The step of forming the low-refractive-index region includes forming the low-refractive-index regions in the semiconductor luminescent devices in a wafer so as to have a width in a longitudinal direction of the waveguide, the widths being different from each other.

With the above-mentioned configuration, it is possible to reduce an aspect ratio of an emission angle, it is possible to satisfy a demand of the emission angle in a short time, or it is possible to reduce a defective fraction in a wafer.

According to another aspect of the present invention, preferably, there is provided a fabrication method of a semiconductor luminescent device. The method includes forming a compound semiconductor layer and forming a low-refractive-index region. The compound semiconductor layer has a structure in which a first conductivity-type clad layer, an active layer, a second conductivity-type clad layer are layered in order on a substrate. The second conductivity-type is different from the first conductivity-type. The low-refractive-index region is in a waveguide in an area to be an end face from which an output light from the waveguide in the compound semiconductor layer is emitted. The low-refractive-index region has an equivalent refractive-index lower than that of another area in the waveguide. The step of forming the low-refractive-index region includes determining a width of the low-refractive-index region in a longitudinal direction of the waveguide according to an emission angle of the output light of a semiconductor luminescent device fabricated in advance, and forming the low-refractive-index region having the width.

With the above-mentioned configuration, it is possible to reduce an aspect ratio of an emission angle, it is possible to satisfy a demand of the emission angle in a short time, or it is possible to reduce a defective fraction in a wafer.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1:
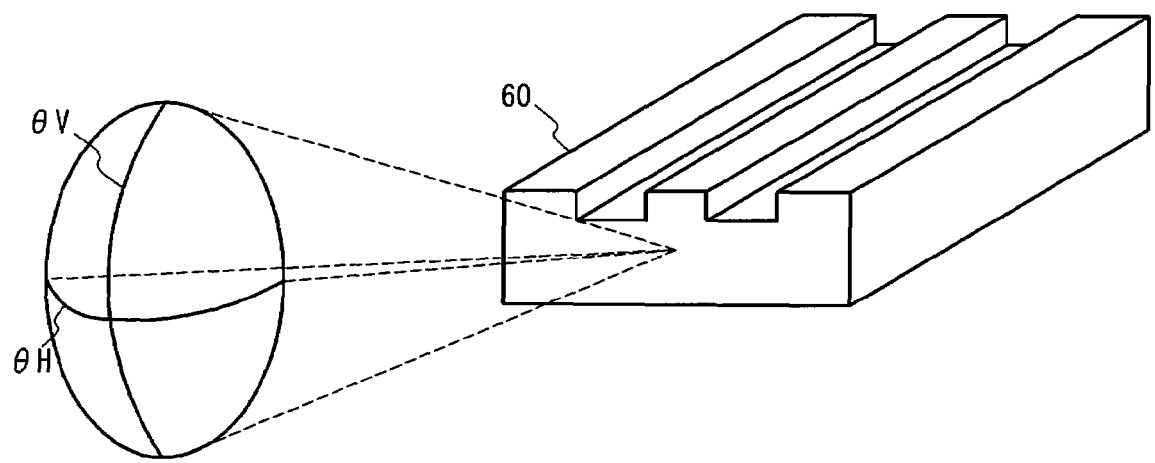
FIG. 1 illustrates an emission angle of a semiconductor laser.
Figure 2:
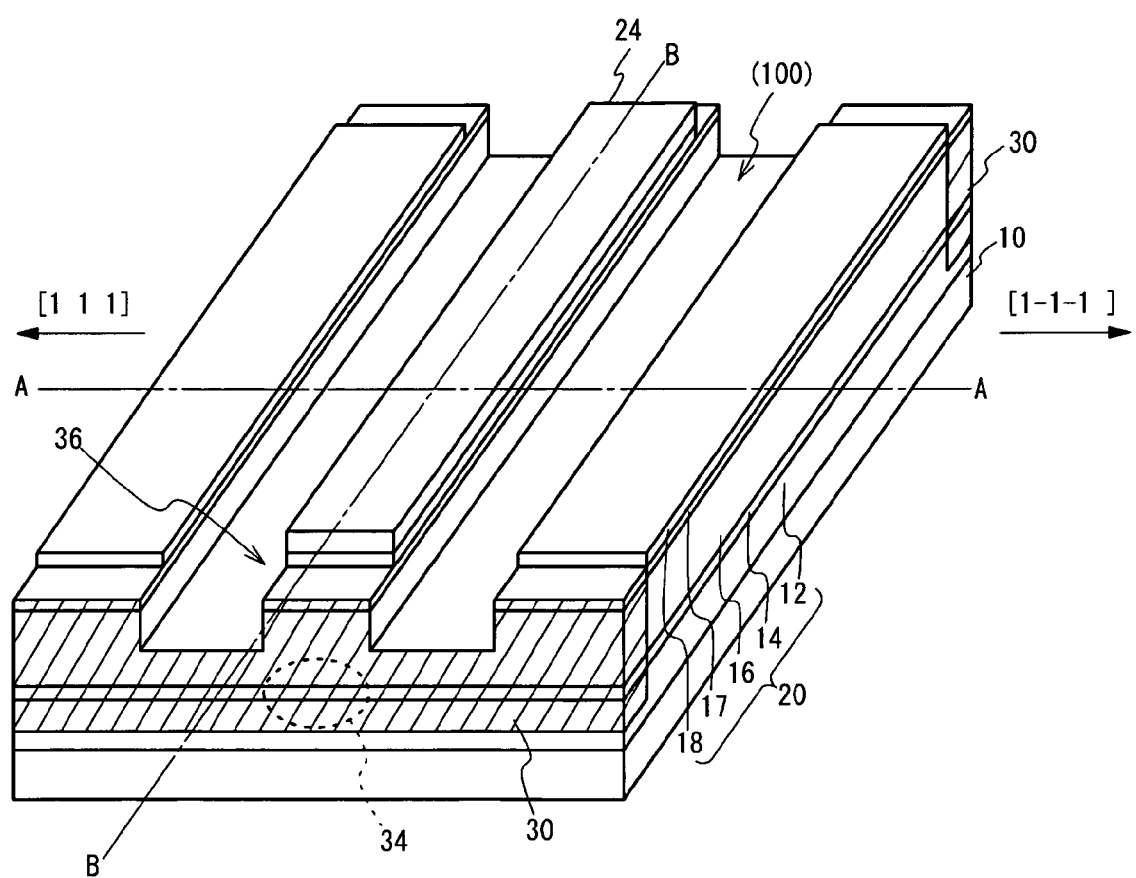
FIG. 2 illustrates a perspective view of a semiconductor laser fabricated through a method in accordance with a first embodiment.
Figure 3A:
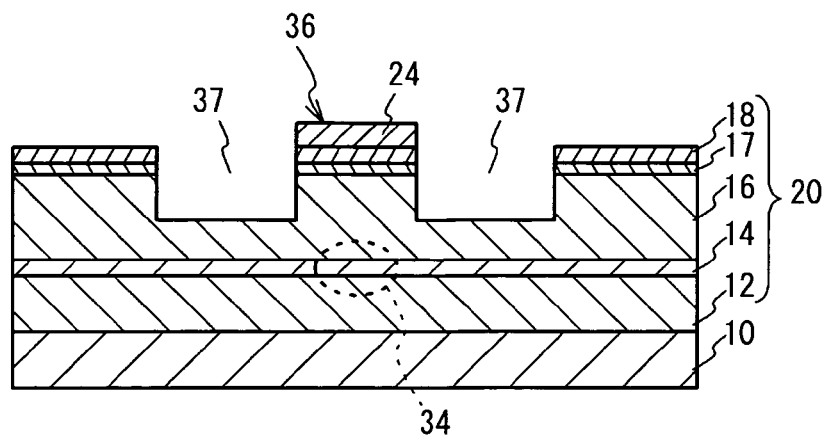
FIG. 3A illustrates a cross sectional view taken along a line A-A of FIG. 2.
Figure 3B:
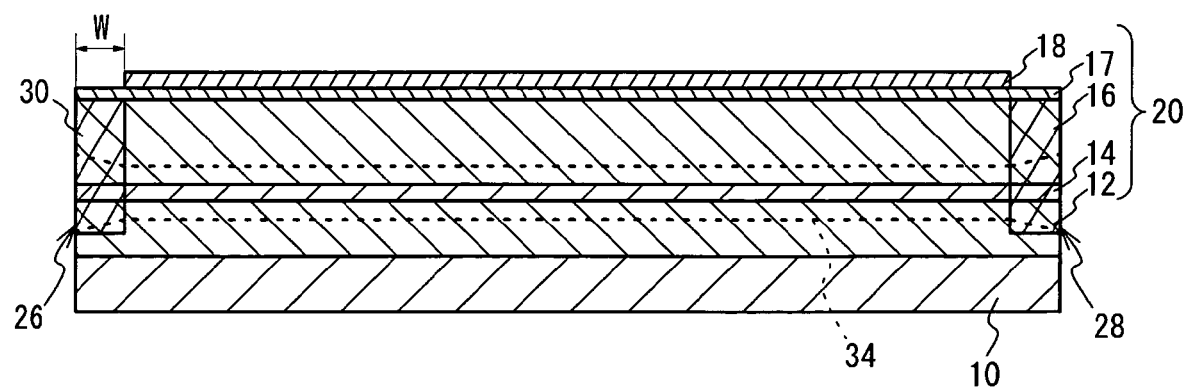
FIG. 3B illustrates a cross sectional view taken along a line B-B of FIG. 2.

A description will be given of a semiconductor laser that emits a wavelength of 660 nm and has a ridge. FIG. 2 illustrates a perspective view of a semiconductor laser. FIG. 3A illustrates a cross sectional view taken along a line A-A of FIG. 2. FIG. 3B illustrates a cross sectional view taken along a line B-B of FIG. 2. As shown in FIG. 2, FIG. 3A and FIG. 3B, an n-type clad layer 12, an active layer 14, a p-type clad layer 16, an intermediate layer 17 and a p-type contact layer 18 are provided on an n-type GaAs substrate 10. A compound semiconductor layer 20 is composed of the n-type clad layer 12, the active layer 14, the p-type clad layer 16, the intermediate layer 17 and the p-type contact layer 18. The n-type clad layer 12 corresponds to the first conductivity-type clad layer. The p-type clad layer 16 corresponds to the second conductivity-type clad layer.

As shown in FIG. 3A, a part of the p-type contact layer 18, a part of the intermediate layer 17 and a part of the p-type clad layer 16 are eliminated, and a recess 37 is formed. A ridge 36 is composed of a part of the p-type contact layer 18, a part of the intermediate layer 17 and a part of the p-type clad layer 16. The ridge 36 is formed between the recesses 37. That is, the compound semiconductor layer 20 includes the ridge 36.

An electrode 24 is provided on the p-type contact layer 18. The electrode 24 ohmically contacts to the p-type contact layer 18. As shown in FIG. 2 and FIG. 3B, a low-refractive-index region 30 is provided on both ends of the compound semiconductor layer 20 in a B-B line direction. The low-refractive-index region 30 has a width of W in a direction along a waveguide 34.

As shown in FIG. 3A, the active layer 14 is between the n-type clad layer 12 and the p-type clad layer 16 that have a low refractive index. A light transmitting in the compound semiconductor layer 20 is housed in the active layer 14 and the around. An equivalent refractive index with respect to a light transmitting in the active layer 14 and the around under the ridge 36 is higher than that in the active layer 14 and the around under the recesses 37 on the both sides of the ridge 36. Therefore, the light transmitting in the active layer 14 and the around is housed in the active layer 14 and the around under the ridge 36. A region, in which the light transmitting in the active layer 14 and the around is housed, is referred to the waveguide 34. The ridge 36 is a convexity formed on the compound semiconductor layer 20 where the waveguide 34 is to be formed. When a current is applied between the electrode 24 and the substrate 10, a light generated in the active layer 14 is housed in the waveguide 34 as mentioned above.

As shown in FIG. 3B, a light in the waveguide 34 is reflected at an end face 26 and an end face 28, the end faces being on the both sides of the compound semiconductor layer 20 respectively. Thus, a light inductively emitted in the waveguide 34 is emitted from the end face as a laser light.

The low-refractive-index region 30 is a part of the compound semiconductor layer 20 where Zn diffuses. The low-refractive-index region 30 is transparent to a 660 nm wavelength of the semiconductor laser. The low-refractive-index region 30 has an equivalent refractive index lower than that of another region of the waveguide 34 in the compound semiconductor layer 20. Here, the equivalent refractive index means a refractive index affecting a light transmitting in the waveguide 34.

Figure 4A:
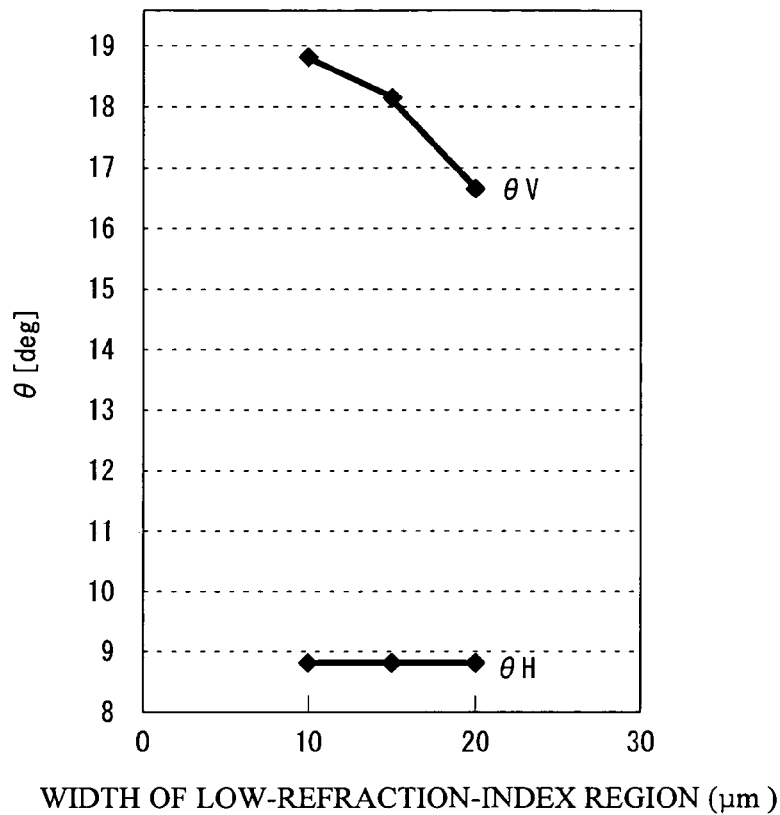
FIG. 4A illustrates a result in a case where a horizontal emission angle $\theta_H$ and a vertical emission angle $\theta_V$ with respect to a low-refractive-index region is measured.

FIG. 4A illustrates a result in a case where a horizontal emission angle $\theta_H$ and a vertical emission angle $\theta_V$ with respect to the width W of the low-refractive-index region 30 in the semiconductor laser is measured. The horizontal emission angle $\theta_H$ is substantially constant when the width W changes from 10 nm to 20 nm. The vertical emission angle $\theta_V$ gets lower when the width W changes from 10 nm to 20 nm.

Figure 4B:
FIG. 4B illustrates a result in a case where a horizontal emission angle $\theta_H$ and a vertical emission angle $\theta_V$ with respect to a low-refractive-index region is calculated.

FIG. 4B illustrates a result in a case where the horizontal emission angle $\theta_H$ and the vertical emission angle $\theta_V$ with respect to the width W of the low-refractive-index region 30 in the semiconductor laser is calculated. The horizontal emission angle $\theta_H$ is substantially constant when the width W changes and the vertical emission angle $\theta_V$ gets lower when the width W changes, as in the case of FIG. 4A. The vertical emission angle $\theta_V$ changes according to the width W because of a reason mentioned below.

As shown in FIG. 3B, a width of a light in the waveguide 34 is enlarged in the low-refractive-index region 30. When the width of the light is enlarged, an emission angle of an output light from the end face 26 is reduced. Therefore, the vertical emission angle $\theta_V$ is reduced. On the other hand, the light in the waveguide 34 is housed less advantageously in the horizontal direction than in the vertical direction. And the waveguide 34 is enlarged in the horizontal direction. Therefore, the waveguide 34 is not very enlarged in the low-refractive-index region 30. And the horizontal emission angle $\theta_H$ is not affected by the width W of the low-refractive-index region 30. A description will be given of embodiments of the present invention using a phenomenon that the vertical emission angle $\theta_V$ is dependent on the width W of the low-refractive-index region 30.

First Embodiment

A first embodiment is an example of forming the low-refractive-index region 30 by doping Zn and of controlling each of the low-refractive-index regions 30 so as to have a different width W in a wafer. A description will be given of a fabrication method of a semiconductor laser in accordance with the first embodiment, with reference to FIG. 5A through FIG. 7C. FIG. 5A through FIG. 6C correspond to a cross sectional view taken along the line B-B of FIG. 2.

Figure 5A:
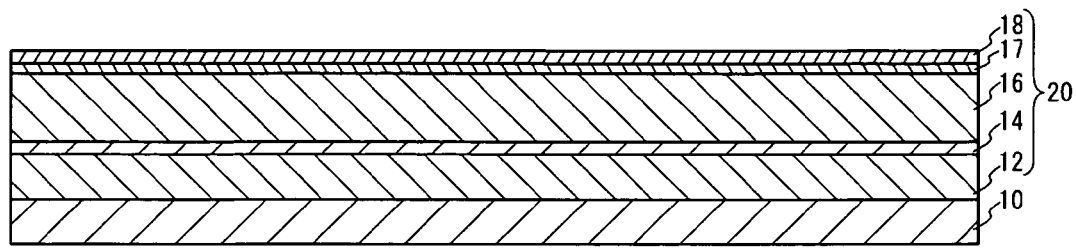
FIG. 5A through FIG. 5C illustrate a cross sectional view showing a fabrication method of a semiconductor laser in accordance with a first embodiment.

As shown in FIG. 5A, the n-type clad layer 12 composed of an AlGaInP layer, the active layer 14 composed of a multi-quantum well (MQW) of InGaP/AlGaInP, the p-type clad layer 16 composed of an AlGaInP layer, the intermediate layer 17 composed of InGaP and the p-type contact layer 18 composed of a GaAs layer in which Zn is doped are grown on the n-type GaAs substrate 10 with a MOCVD method. Through the process, the compound semiconductor layer 20 is fabricated. That is, the compound semiconductor layer 20, in which the n-type clad layer 12 (the first conductivity-type layer), the active layer 14 and the p-type clad layer 16 (the second conductivity-type layer) are layered in order on the substrate 10, is formed. The first conductivity-type is different from the second conductivity-type. A p-type GaAs substrate may be used as the substrate 10. The first conductivity-type may be p-type and the second conductivity-type may be n-type.

Figure 5B:
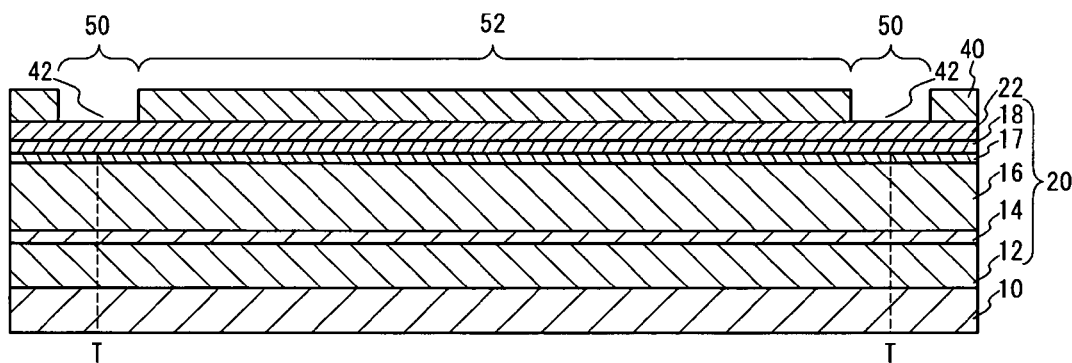

As shown in FIG. 5B, a silicon oxide layer 22 is formed on the p-type contact layer 18 with a CVD method. A photo resist 40 is formed on the silicon oxide layer 22, the photo resist 40 having an opening 42 in a region 50 where the low-refractive-index region 30 is to be formed. The opening 42 of the photo resist 40 is formed with exposure/development using a photo mask such as a reticle. Here, the region 50 is formed around a face T to be an end face from which an output light is emitted. An region 52 is an region except for a region where the low-refractive-index region 30 is to be formed.

Figure 5C:
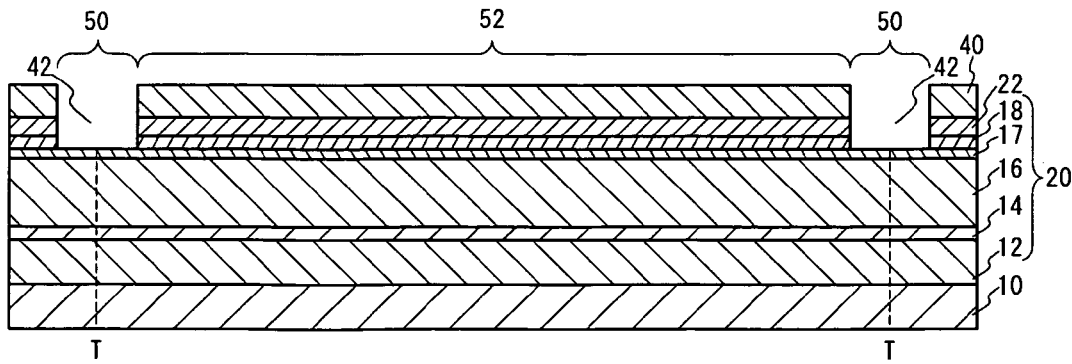

As shown in FIG. 5C, the silicon oxide layer 22 and the p-type contact layer 18 are etched with use of the photo resist 40 for a mask. In this case, the GaAs layer is selectively etched with respect to the InGaP layer. And it is possible to stop the etching at the intermediate layer 17.

Figure 6A:
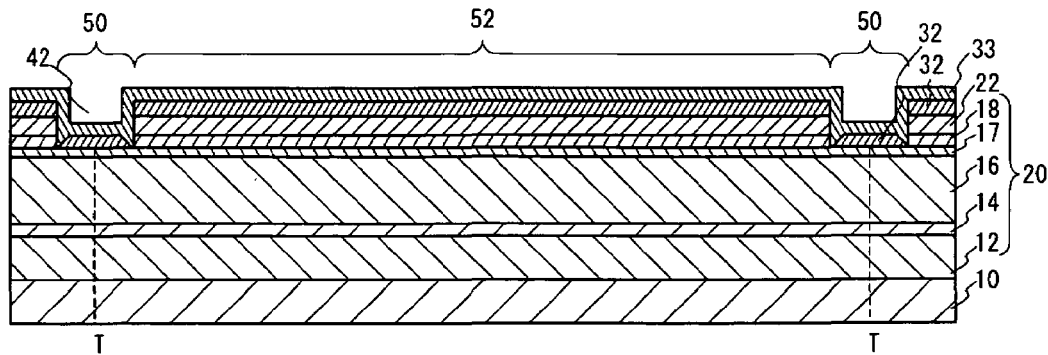
FIG. 6A through FIG. 6C illustrate a cross sectional view showing a fabrication method of a semiconductor laser in accordance with a first embodiment.

As shown in FIG. 6A, the photo resist 40 is eliminated. A diffusion source layer 32 is formed on the silicon oxide layer 22 and on the intermediate layer 17 at a bottom of the opening 42 with an evaporation method, the diffusion source layer 32 being composed of a zinc oxide layer and a silicon oxide layer. A silicon oxide layer 33 is formed on the diffusion source layer 32, and the diffusion source layer 32 is covered.

Figure 6B:
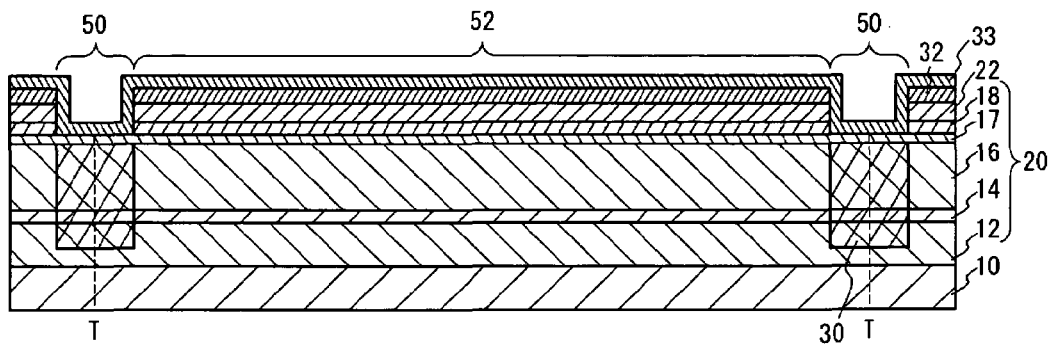

As shown in FIG. 6B, Zn in the diffusion source layer 32 diffuses into the compound semiconductor layer 20 with a thermal treatment. And the low-refractive-index region 30 is formed in the waveguide 34 around the face T (the region 50 including the face T to be the end face 26), the low-refractive-index region 30 having an equivalent refractive index lower than that of the region 52, the face T being to be the end face 26 from which the waveguide 34 in the compound semiconductor layer 20 emits a light.

Figure 7A:
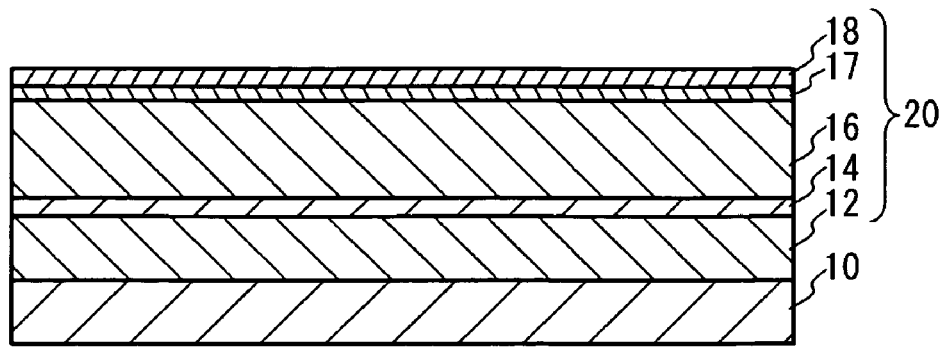
FIG. 7A through FIG. 7C illustrate a cross sectional view showing a fabrication method of a semiconductor laser in accordance with a first embodiment.
Figure 7B:
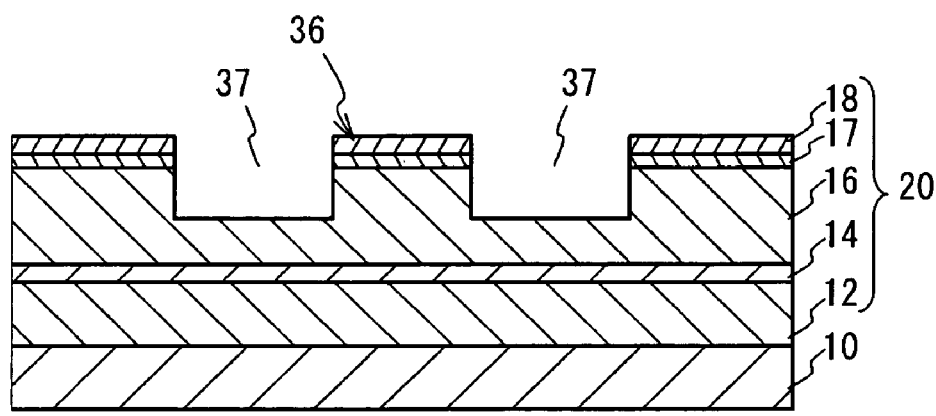
Figure 7C:
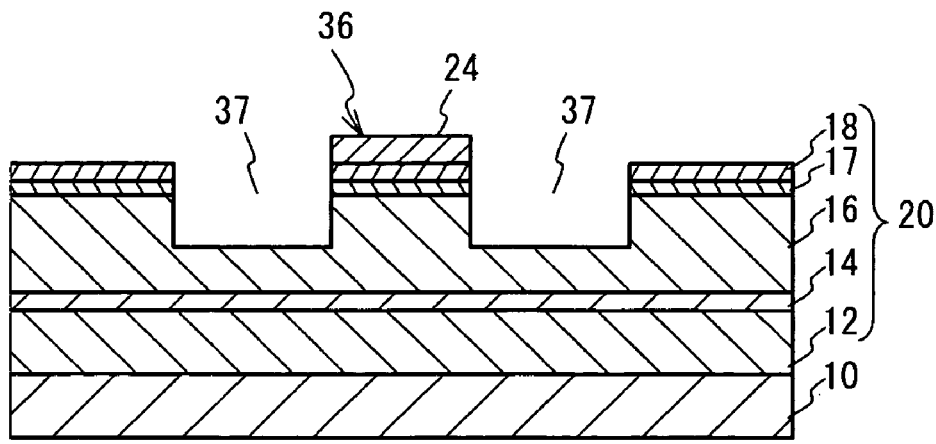

FIG. 7A through FIG. 7C correspond to a cross sectional view taken along the line A-A of FIG. 2. As shown in FIG. 7A, the silicon oxide layer 33 and the silicon oxide layer 22 are eliminated. As shown in FIG. 7B, the recess 37 extending to the p-type clad layer 16 is formed in the compound semiconductor layer 20 with use of a photo resist or an insulating layer for a mask. And the ridge 36 is formed between the recesses 37.

Figure 6C:
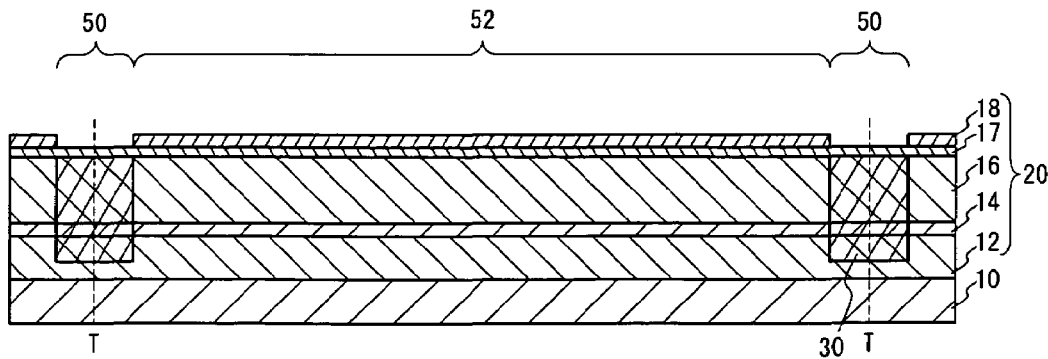

As shown in FIG. 7C, Ti, Mo, and Au are formed in order on the p-type contact layer 18 that is a top layer of the ridge 36. In this process, the electrode 24 is formed. As shown in FIG. 6C, the substrate 10 and the compound semiconductor layer 20 are cleaved along the face T that is to be an end face. Through the processes, the semiconductor laser is fabricated. In addition, an off-substrate can be used as the substrate 10 of the semiconductor laser as shown in FIG. 2, the off-substrate having a surface of which crystal face is oblique toward [1 1 1] direction or toward [1 −1 −1] direction from (1 0 0) face.

Figure 8A:
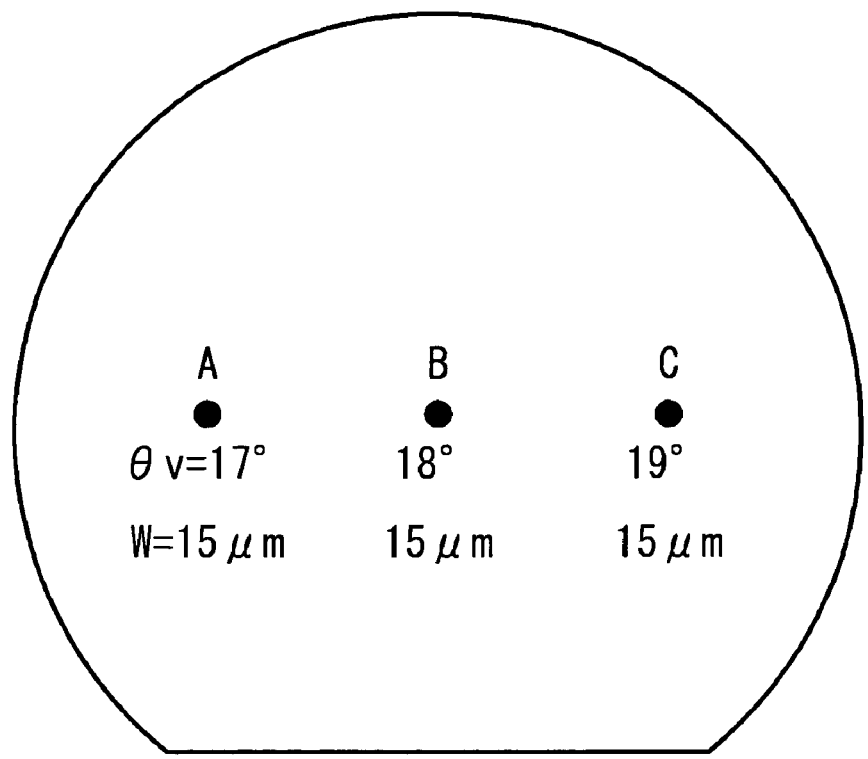
FIG. 8A and FIG. 8B illustrate a fabrication method of a semiconductor laser in accordance with a second embodiment.

FIG. 8A illustrates a wafer on which the semiconductor laser in accordance with the first embodiment is fabricated. In a case where the photo mask has the opening 42 in FIG. 5B and accordingly the width W of the low-refractive-index region 30 is 15 μm, the vertical emission angle $\theta_V$ at a point A on the left side, at a point B on the center and at a point C on the right side on the wafer is 17 degrees, 18 degrees and 19 degrees respectively. The vertical emission angle $\theta_V$ differs depending on a position on the wafer face, because of a dispersion of a thickness or the like of each layer in a growing process of the compound semiconductor layer 20.

Figure 8B:
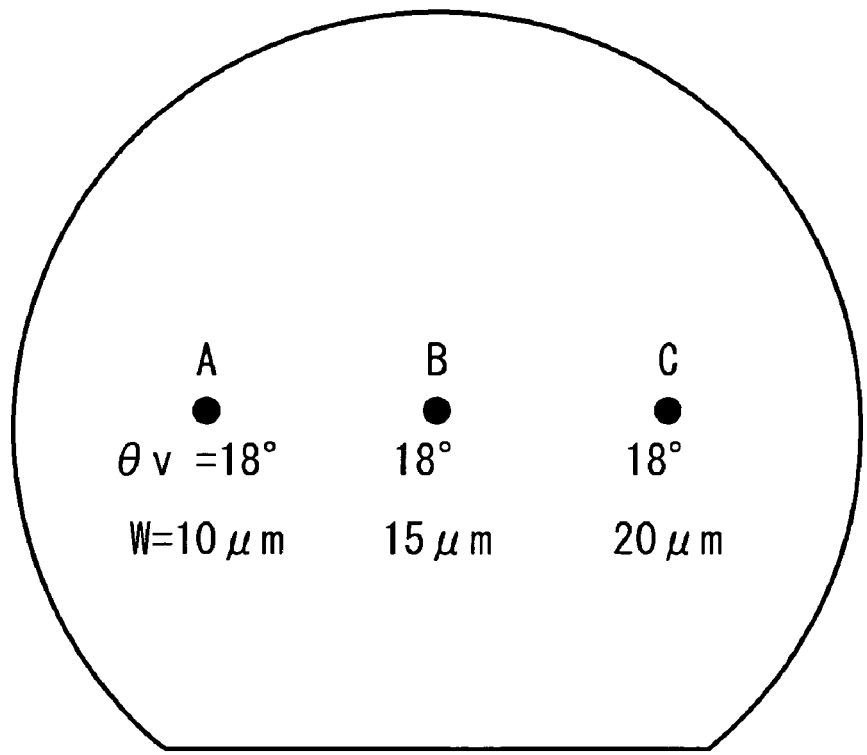

And so, a photo resist is used in the process of FIG. 5B, the photo resist having patterns of which size is different from each other so that the width W of the low-refractive-index region 30 is 10 μm, 15 μm and 20 μm at the points A, B and C respectively as shown in FIG. 8B. And the opening 42 of the photo resist 40 is formed. It is therefore possible to limit the dispersion of the vertical emission angle $\theta_V$ on the wafer face by controlling the width W of the low-refractive-index region 30. In FIG. 8B, the vertical emission angle $\theta_V$ at the point A, B and C is 18 degrees. The dispersion of the vertical emission angle $\theta_V$ on the wafer face is reduced.

In the first embodiment, the low-refractive-index regions 30 in a plurality of the semiconductor lasers in the wafer are formed so as to have the width W in a longitudinal direction of the waveguide 34, the widths W being different from each other. In a case where the vertical emission angle $\theta_V$ differs depending on a position on the wafer face because of a dispersion of the thickness of the compound semiconductor layer 20 as shown in FIG. 8A, it is possible to compensate for the dispersion of the vertical emission angle $\theta_V$ caused by the dispersion of the thickness of the compound semiconductor layer 20 in the wafer when each of the widths W of the low-refractive-index regions 30 is different in the wafer as shown in FIG. 8B. In this case, the dispersion of the vertical emission angle $\theta_V$ is reduced and it is possible to reduce a defective fraction of the semiconductor laser. In a case where a wafer having a large diameter is used, it is possible to reduce the defective fraction advantageously.

As shown in FIG. 8B, the low-refractive-index regions 30 are formed with use of a photo mask having patterns of which size is different from each other so that the width W of the low-refractive-index regions 30 is different from each other. It is easily possible to form the low-refractive-index regions 30 of which width W is different from each other with use of a photo mask having patterns of which size is different from each other.

Further, a layer including a zinc oxide and a silicon oxide is formed so as to contact to the region 50 that is to be the low-refractive-index region 30, as shown in FIG. 6A. And Zn included in the zinc oxide diffuses into the compound semiconductor layer 20 in the region 50 that is to be the low-refractive-index region 30, as shown in FIG. 6B. It is thus possible to form the low-refractive-index region 30.

Second Embodiment

A second embodiment is an example of forming the low-refractive-index regions 30 by changing the widths W thereof so as to be different from each other according to an emission angle of an output light of a semiconductor laser fabricated in advance. The same components have the same reference numerals in order to avoid a duplicated explanation.

Figure 9:
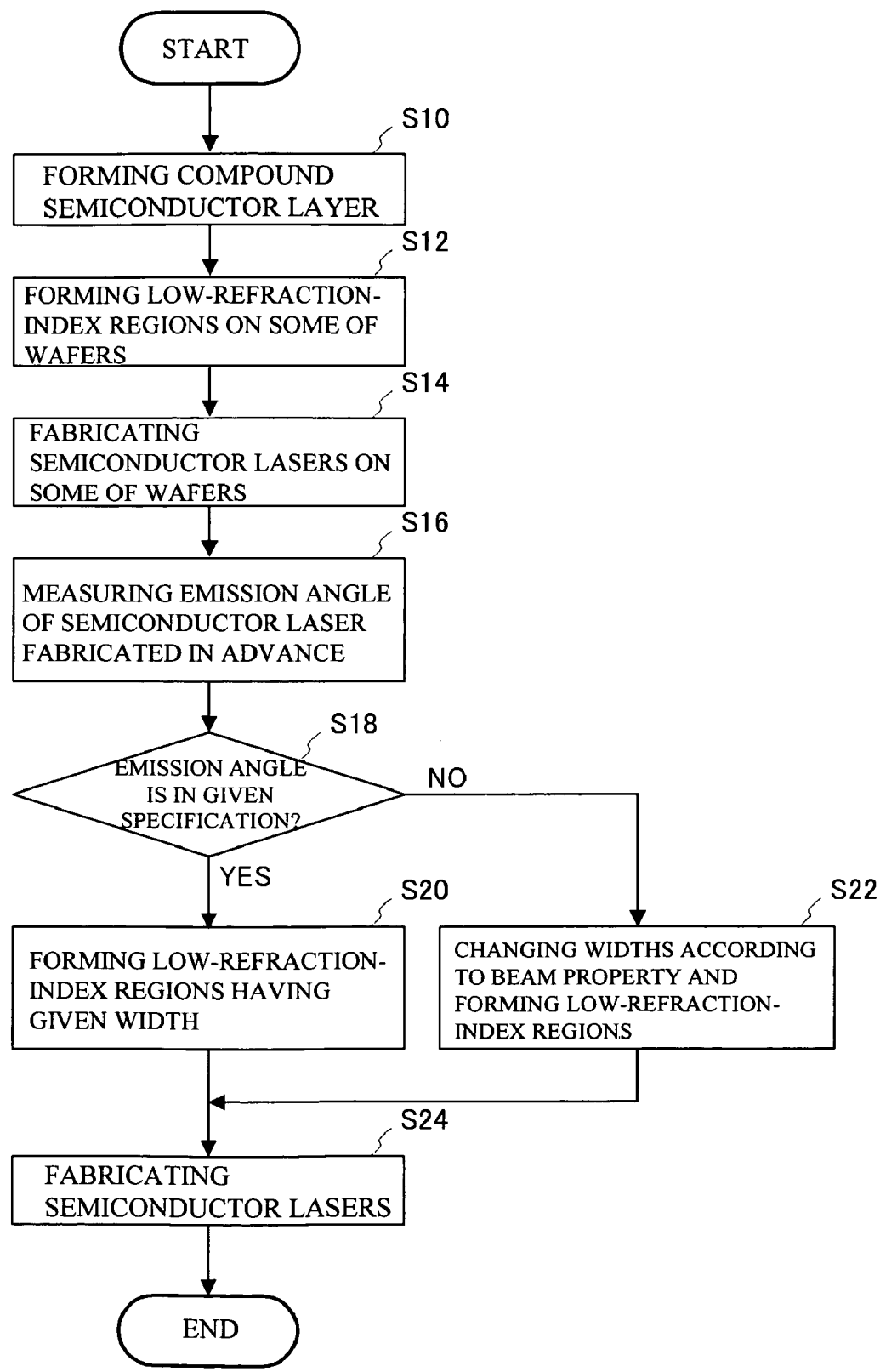
FIG. 9 illustrates a flow chart showing a fabrication method of a semiconductor laser in accordance with a second embodiment.

FIG. 9 illustrates a flow chart showing a fabrication method of a semiconductor laser in accordance with the second embodiment. The compound semiconductor layer 20 is formed on the substrate 10 as in the case of FIG. 5A (step S10). In step S10, wafers grown at a time, wafers grown in a same condition or a part of a wafer is used, and the low-refractive-index regions 30 are formed through the processes shown in FIG. 5B through FIG. 6B (step S12). In this case, the opening 42 of the photo resist 40 shown in FIG. 5B is formed so that each of the widths W of the low-refractive-index regions 30 formed in the process of FIG. 6B is a given value. Through the processes of FIG. 6C through FIG. 7C, the semiconductor laser is fabricated in advance (step S14).

Figure 12:
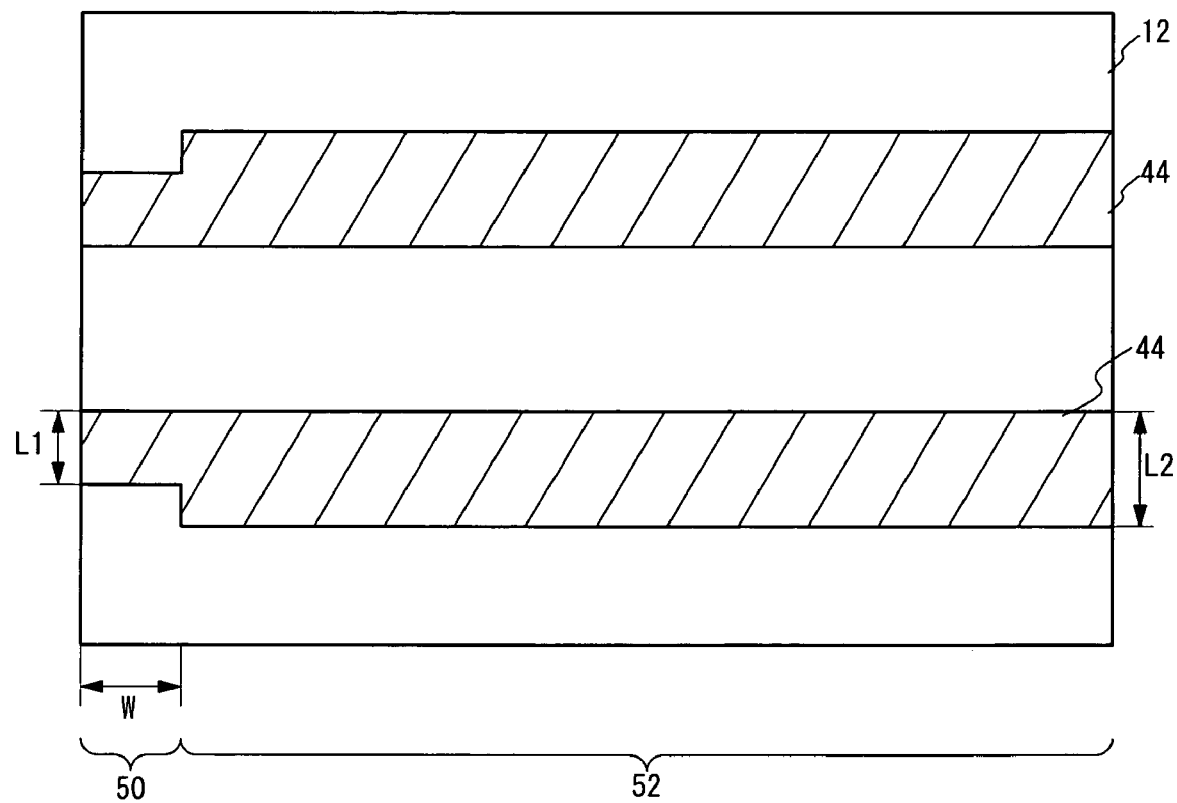
FIG. 12 illustrates a top view showing a fabrication method of a semiconductor laser in accordance with a fourth embodiment.

An emission angle of the semiconductor laser fabricated in advance is measured (step S16). It is determined whether the emission angle is in a given specification (step S18). If it is determined that the emission angle is in the specification in step S18, the processes of FIG. 5B through FIG. 6B are treated to the other wafers, and the low-refractive-index regions 30 having the width W as in the case of FIG. 12 is formed (step S20). If it is determined that the emission angle is not in the specification in step S18, the width W is changed according to the emission angle and the low-refractive-index regions 30 are formed (step S22). In a case where the vertical emission angle $\theta_V$ is higher than the specified value, the width W is controlled so as to be enlarged. In a case where the vertical emission angle $\theta_V$ is lower than the specified value, the width W is controlled so as to be reduced. The semiconductor laser is fabricated as in the case of step S14 (step S24). Through the processes mentioned above, the semiconductor laser in accordance with the second embodiment is fabricated.

In the second embodiment, the width W is controlled according to the emission angle (for example, the vertical emission angle $\theta_V$) of an output light from the semiconductor laser fabricated in advance in step S12 and step S14. And the low-refractive-index region 30 is formed. It is therefore possible to limit the dispersion of the emission angle caused by the growth of the compound semiconductor layer 20, if the width W is controlled according to the emission angle of the semiconductor laser fabricated with use of the wafers grown at a time or in the same condition.

In the first and the second embodiments, an emission angle of an output light is controlled with the width W of the low-refractive-index region 30. For example, a wafer where the compound semiconductor layer 20 is grown is fabricated following the second embodiment. The number of the wafer is determined according to the emission angle and the required number of the semiconductor laser. The width of the low-refractive-index region 30 is changed. And it is thus possible to fabricate the semiconductor laser. In addition, in a case where more than one different values of the emission angle is required, a plurality of the low-refractive-index regions 30 are formed on a wafer following the first embodiment, the regions having a width W different from each other. And the semiconductor laser is fabricated.

Therefore, it is not necessary to grow the compound semiconductor layer 20, the epitaxial layer, according to the required emission angle. And it is not necessary to control the thickness of the compound semiconductor layer 20. It is thus possible to fabricate the semiconductor laser according to the required emission angle at short times.

In addition, the description is given of the case where the vertical emission angle $\theta_V$ is controlled to be a desirable value with the width W of the low-refractive-index region 30, in the first and the second embodiment. It is possible to reduce the aspect ratio of the emission angle by reducing the vertical emission angle $\theta_V$. The first and the second embodiments can be used for reducing the aspect ratio of the emission angle or for controlling the aspect ratio of the emission angle to be a desirable value. The first and the second embodiments are of a case where the vertical emission angle $\theta_V$ is controlled. An emission angle except for the vertical emission angle $\theta_V$ may be controlled with the control of the width of the low-refractive-index region 30.

Third Embodiment

Figure 10:
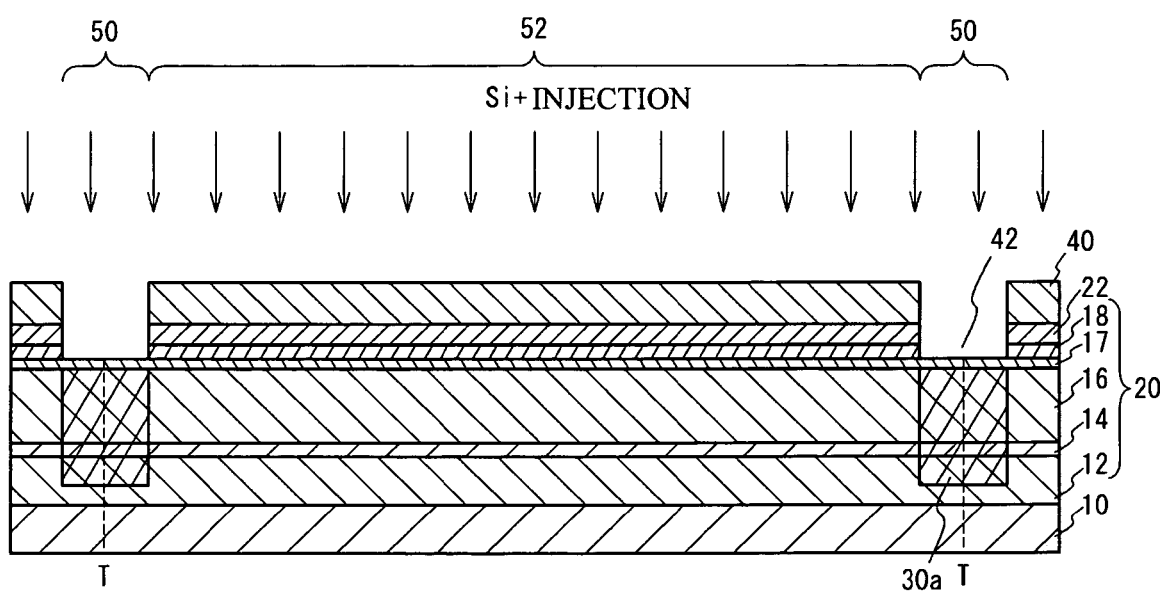
FIG. 10 illustrates a cross sectional view showing a fabrication method of a semiconductor laser in accordance with a third embodiment.

A third embodiment is of a case where the low-refractive-index region 30 is formed with an ion implantation method. The same components have the same reference numerals in order to avoid a duplicated explanation. In the third embodiment, as shown in FIG. 10, silicon ion $Si^+$ is implanted as an impurity into the compound semiconductor layer 20 of the region 50 with use of the photo resist 40 for a mask, after the processes from FIG. 5A through FIG. 5C. The photo resist 40 is eliminated. And the low-refractive-index region 30 is formed through a thermal treatment. The processes of FIG. 6C through FIG. 7C in the first embodiment are completed. And the semiconductor laser is fabricated. The low-refractive-index region 30 may be formed with the ion implantation method in the first and the second embodiments, similarly to the third embodiment.

Fourth Embodiment

Figure 11A:
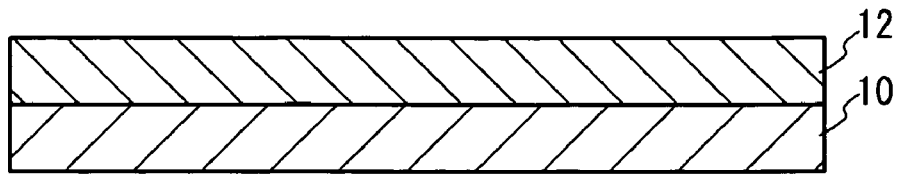
FIG. 11A through FIG. 11C illustrate a cross sectional view showing a fabrication method of a semiconductor laser in accordance with a fourth embodiment.
Figure 11B:
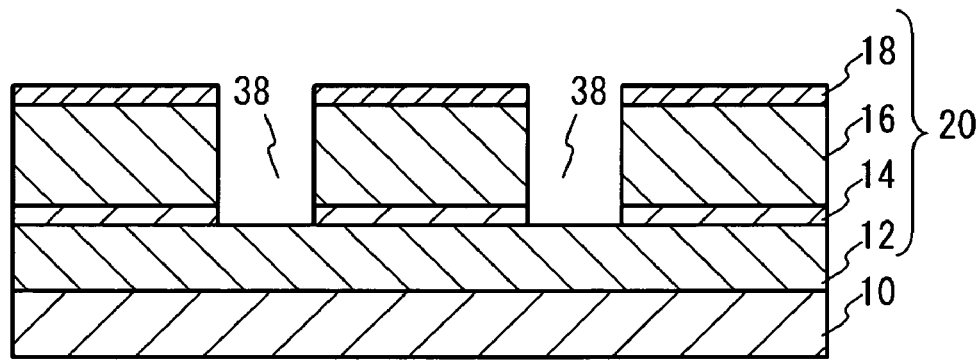
Figure 11C:
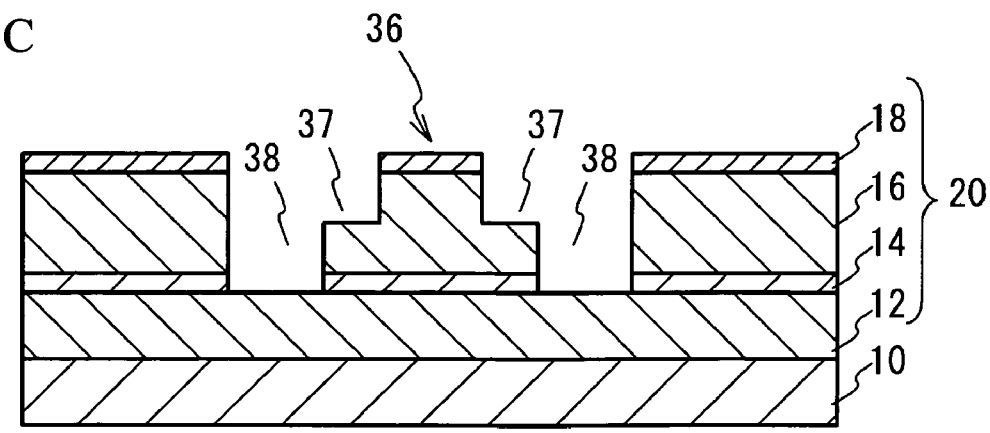

A fourth embodiment is of a case where at least a part of the compound semiconductor layer in the low-refractive-index region is thinner than that of another region. FIG. 11A through FIG. 11C correspond to a cross sectional view taken along the line A-A of FIG. 13. As shown in FIG. 11A, the n-type clad layer 12, a part of the compound semiconductor layer, is grown on the n-type GaAs substrate 10. As shown in FIG. 12, a growth-inhibiting mask 44 is formed on the n-type clad layer 12. The growth-inhibiting mask 44 is, for example, an insulating layer composed of such as silicon oxide and is formed with a CVD method or the like. The growth-inhibiting mask 44 is provided on the both sides of a region that is to be the waveguide. A width L1 of the growth-inhibiting mask 44 in the region 50 in a longitudinal direction of the waveguide is controlled to be lower than a width L2 of the region 52, the region 50 being to be the low-refractive-index region 30. As shown in FIG. 11B, the active layer 14 of the MQW, the p-type clad layer 16 and the p-type contact layer 18 are grown on the substrate 10. In this case, these layers are not grown on the growth-inhibiting mask 44. Then, the growth-inhibiting mask 44 is eliminated. The compound semiconductor layer 20, which has the recess 38 in an area where the growth-inhabiting mask 44 is formed, is thus fabricated. As shown in FIG. 11C, the recess 37 extending to the p-type clad layer 16 is formed on the both sides of the ridge 36 as in the case of FIG. 7B of the first embodiment. The electrode 24 is formed as in the case of FIG. 7C. And the semiconductor laser is fabricated.

Figure 13:
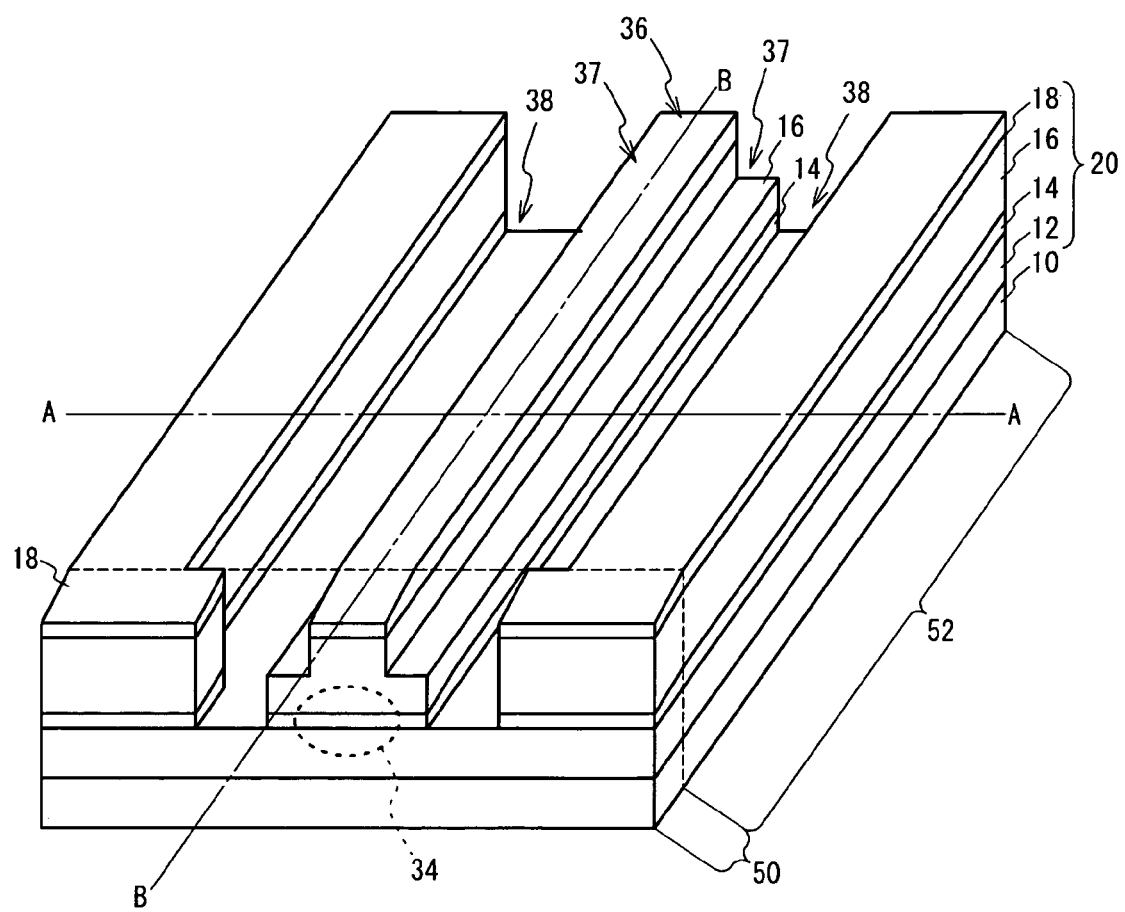
FIG. 13 illustrates a perspective view of a semiconductor laser fabricated through a method in accordance with a fourth embodiment.
Figure 14:
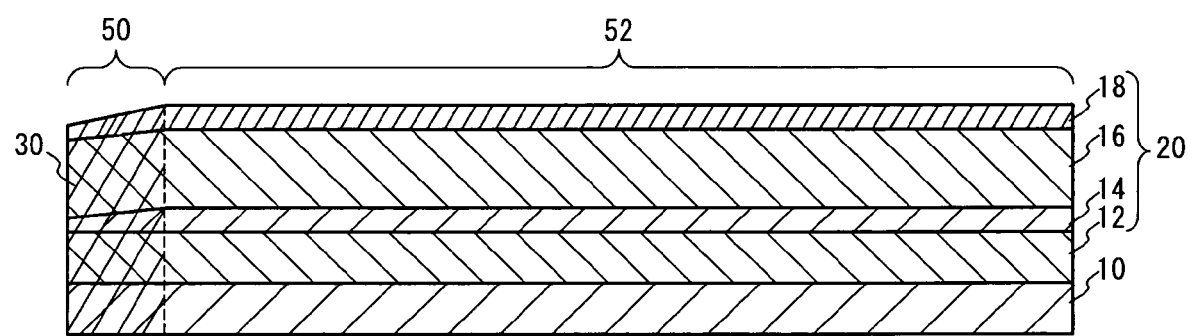
FIG. 14 illustrates a cross sectional view taken along a line B-B of FIG. 13.

FIG. 13 illustrates a perspective view of the semiconductor laser. FIG. 14 illustrates a cross sectional view taken along a line B-B of FIG. 13. The same components have the same reference numerals in order to avoid a duplicated explanation.

As shown in FIG. 13, the recess 37 extending to the p-type clad layer 16 is formed on the both sides of the ridge 36. The recess 38 is formed outside of the recess 37. In FIG. 12, the width L1 of the growth-inhibiting mask 44 in the region 50 is lower than the width of the region 52, the region 50 being to be the low-refractive-index region 30. Therefore, the width of the region 50 in the recess 38 (the width of the waveguide) is lower than that of the region 52, the region 50 being to be the low-refractive-index region. Therefore, the thickness of the active layer 14, the p-type clad layer 16 and the p-type contact layer 18 regrown on the n-type clad layer 12 in the low-refractive-index region 30 is lower than that of the region 52, as shown in FIG. 14. And the equivalent refractive index of the low-refractive-index region 30 is lower than that of the region 52. In the first and the second embodiments, it is possible to form the layers 14, 16 and 18 so that the thickness of the layers is lower than that of the region 52 in the waveguide 34 as in the case of the fourth embodiment, the region 50 layers being at least a part of the compound semiconductor layer 20.

In the first embodiment, the low-refractive-index region 30 is formed around the end face 26 from which an output light is emitted, and around the end face 28, as shown in FIG. 3B. The low-refractive-index region 30 may be formed only on the end face from which the output light is emitted, as in the case of the fourth embodiment. And in the fourth embodiment, the in-plane dispersion can be corrected if the width of the low-refractive-index region 30 is controlled as in the case of FIG. 8B of the first embodiment.

In the first embodiment through the fourth embodiment, a description is given of the semiconductor laser having the ridge 36 as a semiconductor luminescent device. The present invention can be applied to other semiconductor lasers such as a refractive-index-guide-type laser, a loss-guide-type laser and a gain-guide-type laser. In the first embodiment through the fourth embodiment, a description is given of the semiconductor laser emitting a wavelength of 660 nm. The present invention can be applied to a semiconductor laser emitting all wavelengths such as an optical wavelength laser used for an optical storage device, a laser that is used for an optical communication and emits such as 1.3 μm or 1.55 μm.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2006-010789 filed on Jan. 19, 2006, the entire disclosure of which is hereby incorporated by reference.

What is claimed is:

1. A fabrication method of a semiconductor luminescent device comprising:
    forming a compound semiconductor layer having a structure in which a first conductivity-type clad layer, an active layer, a second conductivity-type clad layer are layered in order on a substrate,
    the second conductivity-type being different from the first conductivity-type; and
    forming a low-refractive-index region in a waveguide in an area to be an end face from which an output light from the waveguide in the compound semiconductor layer is emitted,
    the low-refractive-index region having an equivalent refractive-index lower than that of another area in the waveguide,
    wherein the step of forming the low-refractive-index region comprises forming the low-refractive-index regions in the semiconductor luminescent devices in a wafer so as to have a width in a longitudinal direction of the waveguide,
    the widths being different from each other.

2. The method as claimed in claim 1, wherein the step of forming the low-refractive-index region comprises forming the low-refractive-index regions so that the widths of the low-refractive-index regions in the longitudinal direction of the waveguide are different from each other, with use of photo masks of which size is different from each other.

3. The method as claimed claim 1, wherein the step of forming the low-refractive-index region comprises:
    forming a layer including zinc oxide and silicon oxide so as to contact to a region to be the low-refractive-index region; and
    diffusing zinc of the zinc oxide into the compound semiconductor layer in the region to be the low-refractive-index region.

4. The method as claimed in claim 1, wherein the substrate is an off-substrate having a surface of which crystal face is oblique toward [1 1 1] direction or toward [1 −1 −1] direction from (1 0 0) face.

* * * * *